United States Patent [19]

Simmons et al.

[11] Patent Number: 4,714,949

[45] Date of Patent: Dec. 22, 1987

[54] ELECTROSTATIC DISCHARGE PROTECTION USING THIN NICKEL FUSE

[75] Inventors: Arturo Simmons; Shawn T. Walsh, both of Garland; Charles G. Roberts, McKinney, all of Tex.

[73] Assignee: Texas Instruments Incorporated, Dallas, Tex.

[21] Appl. No.: 907,130

[22] Filed: Sep. 12, 1986

Related U.S. Application Data

[63] Continuation of Ser. No. 656,111, Sep. 28, 1984, abandoned.

[51] Int. Cl.[4] .................... H01L 29/78; H01L 27/14; H01L 27/10; H01L 27/02
[52] U.S. Cl. .................... 357/23.13; 357/30; 357/45; 357/51; 357/61
[58] Field of Search .................... 357/30, 51, 62, 45, 357/23.13

[56] References Cited

U.S. PATENT DOCUMENTS

| | | | |
|---|---|---|---|
| 4,045,310 | 8/1977 | Jones et al. | 357/51 |
| 4,072,976 | 2/1978 | Hasari | 357/51 |
| 4,206,003 | 6/1980 | Koehler | 357/30 |
| 4,360,732 | 11/1982 | Chapman et al. | 357/30 |
| 4,437,969 | 3/1984 | Covington et al. | 357/51 |

Primary Examiner—J. Carroll
Attorney, Agent, or Firm—Carlton H. Hoel; Leo N. Heiting; Melvin Sharp

[57] ABSTRACT

The disclosure relates to a system for protecting HgCdTe and the like MIS arrays from breakdown during fabrication due to electrostatic charge buildup on the array capacitors. This is accomplished by building into the structure a short circuit across the capacitor plates with a fuse region therein that will evaporate when a voltage is placed thereacross which is sufficient to cause evaporation and low enough not to damage the capacitors.

12 Claims, 5 Drawing Figures

ELECTROSTATIC DISCHARGE PROTECTION USING THIN NICKEL FUSE

This application is a continuation of application Ser. No. 656,111, filed Sept. 28, 1984, abandoned.

BACKGROUND OF THE INVENTION

1. Field of the Invention

This invention relates to mercury-cadmium telluride (HgCdTe) MIS arrays, and, more specifically, to a method of protecting against electrostatic discharges across the dielectric during array fabrication which cause damage and/or imprefections in the array elements.

2. Description of the Prior Art

MIS array elements are susceptible to charge buildup and ultimate catastorphic breakdown in the insulator due to the voltage that can be built up because the elements are capacitors and include insulators which are not perfect and have a breakdown voltage. Charges on these capacitors can be picked up anywhere during processing or handling of the elements themselves. Prior art MIS elements of the type involved herein normally include a HgCdTe substrate which is one plate of the capacitor and which has an oxide passivating layer thereon, further insulating layer of zinc sulfide over the oxide layer and a gate electrode over the insulating layer. This is the basic unit of all infrared focal plane imagers. The gate forms the other plate of the capacitor and any charge built up thereon which is too large will break down the dielectric and cause a short circuit. The problems encountered by this action are not only catastrophic failure noted above but also the problem that, though a short circuit does not exist, the insulating layer may have been damaged to the extent tha the flat band voltage varies due to a voltage across the insulator during manufacture which is not enough to cause breakdown, but is enough to move the fixed charge in the oxide layer and in the active region therefrom. Furthermore, due to the problem of breakdown as described hereinabove, the prior art MIS arrays are normally probed to locate faulty elements. This also presents a problem in that the function of probing itself causes breakdown of elements to some extent, thereby further reducing the ultimate yield. The above noted problem exists only in HgCdTe and similar type compounds wherein zener diodes (avalanche conduction at a voltage above MIS operating voltage but below MIS breakdown voltage) cannot be formed as in the case of silicon and the like. Accordingly, the solution to the problem described hereinabove can not be provided by the addition of a diode between the bonding pad and the HgCdTe substrate as is done in silicon and other materials wherein diodes can be formed in the substrate itself.

SUMMARY OF THE INVENTION

In accordance with the present invention, the above problems of the prior art are materially reduced and there is provided a method by which MIS arrays can be formed with substantially higher yields due to a reduction in the number of elements having short circuits or imperfections therein due to the buildup of voltage on the capacitor plates during fabrication. Briefly, this is accomplished by providing a substrate of n-type mercury cadmium telluride as in the prior art and forming a passivating oxide layer thereon and a zinc sulfide layer over the passivating layer as in the prior art. With reference now to only one of the many identically produced array elements, the procedure is now altered by forming a via through the zinc sulfide insulator and passivating oxide layers to the substrate prior to forming a nickel gate structure of novel design. The nickel gate structure includes the gate region as well as a reduced cross sectional region which acts as a fuse and is about one tenth the width of the gate or less and extends through the via and contacts the substrate. An aluminum bus line is formed over the via and extends therein and a further aluminum portion is formed over the gate portion to act as a via etch stop. A second zinc sulfide layer is then formed over the entire surface of the array and second a via is then formed extending from the top of the second zinc sulfide layer to the via etch stop. An indium bond pad is then formed on the surface of the second zinc sulfide layer and extends through the second via therein to the via etch stop to provide external connection to the gate.

It can be seen that, from the point at which the gate structure is formed, there is a continual short circuit from the gate structure to the substrate during the remainder of the processing steps. Accordingly, any charge buildup on the gate structure will be dissipated via the short circuit to the substrate. After completion of the array and preferably just prior to installation, a voltage which is sufficient to blow the fuse but not high enough to cause damage to the array is applied across the substrate and the bond pad to remove the short circuit. At this point, protection of the array from an overvoltage will be provided by the circuitry in which the array is disposed.

DESCRIPTION OF THE PREFERRED EMBODIMENT

Figure 1:
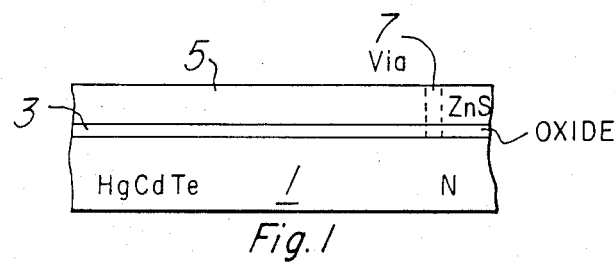
FIG. 1 is a schematic drawing of a partially formed array produced in accordance with the present invention.
Figure 2A:
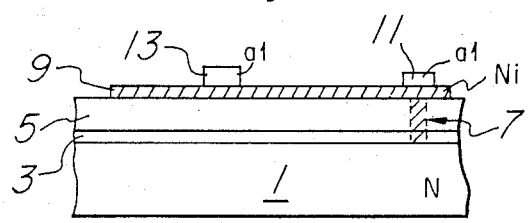
FIG. 2A is a view as in FIG. 1 with the process farther advanced.
Figure 2B:
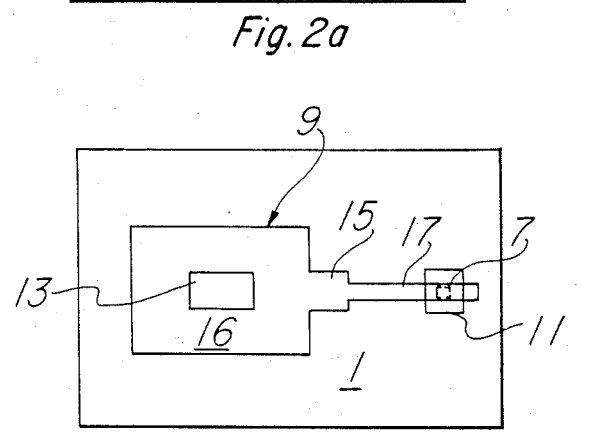
FIG. 2B is a top view of the embodiment of FIG. 2A.

Referring now to FIG. 1, there is shown a mercury cadmium telluride substrate 1 of n-type having an oxide passivating layer 3 thereon which is formed by placing the substrate 1 in electrolyte solution in known manner. A zinc sulfide insulating layer 5 is formed over the passivating layer 3 by vacuum deposition in standard manner and a via 7 is then etched through the insulating layer 5 and passivating layer 3 to the substrate 1 by appropriate masking and etching using an appropriate etchant containing 1/16 of 1% bromine in methanol by volume. Referring now to FIGS. 2A and 2B, the procedure continues by providing a patterned photoresist and then evaporating nickel fuse and gate 9 in standard manner of about 50 to 100 angstroms over the zinc sulfide and into the via 7 in those regions where the photoresist is not deposited. An aluminum bus line 11 which extends into the via 7 along with the nickel 9 therein is then deposited in standard manner and makes electrical contact with the nickel and a further aluminum via stop 13 as deposited simultaneously therewith which makes electrical contact with the nickel layer 9 and acts as a via stop which will be discussed in more detail hereinbelow. With specific reference to FIG. 2B, it can be seen that the nickel layer 9 includes areas of reduced thickness 15 and 17, the region 17 being designed to operate as a fuse at a voltage below the voltage at which the array would become damaged and having a width of about 0.2 mils. As can be seen from FIG. 2B the nickel portion 17 extends into the via 7 as discussed above. The region 16 will be the gate of the final array element.

Figure 3:
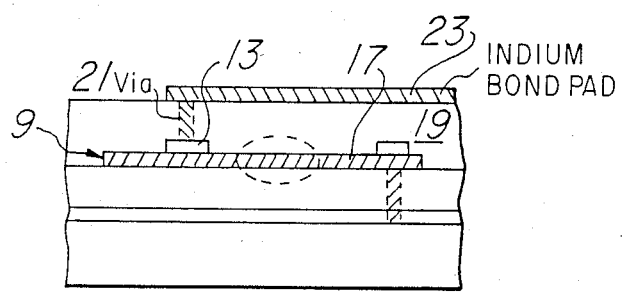
FIG. 3 is a view as in FIG. 2A with the process still farther advanced.
Figure 4:
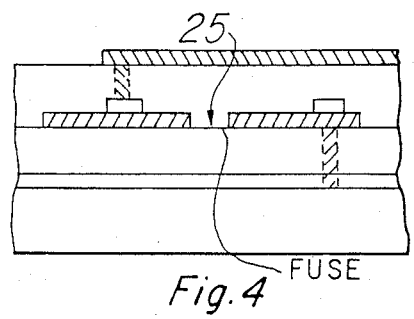
FIG. 4 is a view as in FIG. 3 showing the completed array after fabrication and fuse removal.

Referring now to FIG. 3, it can be seen that a second zinc sulfide layer 19 is formed over the top surface of the array in the same manner as the layer 5 was formed and a via 21 is formed therein by masking and etching in the same manner discussed above for layer 5 and via 7. Via 21 extends from the top surface of the zinc sulfide layer 19 to the aluminum via stop 13. The aluminum in the via stop 13 acts as a stop for the bromine in methanol etchant utilized as discussed hereinabove. An indium bond pad 23 is then vacuum deposited in standard patterned manner on the top surface of the zinc sulfide layer 19, the indium extending into via 21 to make contact with the aluminum via stop 13 and thereby make contact with the nickel gate region 16. It can be seen that during the entire processing of the array through the steps described hereinabove, the gate region 16 is constantly short circuited to the substrate 1 from the time of its formation, thereby preventing the formation of short circuits or other deleterious effects to array elements during the processing. At this point, a voltage which is sufficient to open the fuse 17 but insufficient to cause breakdown of the dielectric layer 5 is applied between the bond pad 23 and the substrate 1 to open the fuse 17 as shown in FIG. 4 at the opening 25 to isolate the gate region 16 from the remainder of the fuse circuit.

It can be seen that there has been provided a relatively simple and inexpensive method for forming MIS arrays in a mercury cadmium telluride substate which minimizes losses and yield due to short circuit and other deleterious effects causing faulty operation of the array elements.

It should be understood that while the materials set forth above are preferred, any semiconductor substate in which MIS or MOS type devices are desired are acceptable substrates. Also, insulators other than zinc sulfide may be used and gate materials other than nickel can be used, nickel being preferred when light transmissive contacts are desirable.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A MIS array semiconductor device in which each device comprises:
    (a) a semiconductor substrate,
    (b) a first insulating layer on said substrate, and
    (c) an electrically conductive layer on said insulating layer, said conductive layer being patterned into an MIS element, said element including a gate and a fuse, said first insulating layer forming the gate insulator and defining a first via therethrough associated with said MIS element, said fuse being a narrow portion of said conductive layer connected at one end to said gate and connected at the other end to said substrate through said first via, said gate connected to a bond pad, said narrow portion of width being sufficiently thin to blow the fuse with a voltage applied to said gate relative to said substrate that is below the minimum voltage required to damage said insulating layer or substantially move fixed charge in said insulating layer,
    (d) whereby said fuse short circuits the MIS capacitor formed by said gate with said substrate until said fuse is blown.

2. A semiconductor device as set forth in claim 1 wherein gate region has a cross-sectional area at least about ten times the cross-sectional area of said fuse region.

3. A semiconductor device as set forth in claim 1 further including a second insulating layer disposed over said conductive layer and defining a second via therethrough associated with each MIS element and a bond pad on said second insulating layer electrically coupled to said gate region.

4. A semiconductor device as set forth in claim 2 further including a second insulating layer disposed over said conductive layer and defining a second via therethrough associated with each MIS element and a bond pad on said second insulating layer electrically coupled to said gate region.

5. A semiconductor device as set forth in claim 1 wherein said substrate is HgCdTe, said first insulating layer is ZnS and said electrically conductive layer is taken from the class consisting of Ni, Al and Ni selectively coated with Al.

6. A semiconductor device as set forth in claim 2 wherein said substrate is HgCdTe, said first insulating layer is ZnS and said electrically conductive layer is taken from the class consisting of Ni, Al and Ni selectively coated with Al.

7. A semiconductor device as set forth in claim 3 wherein said substrate is HgCdTe, said first insulating layer is ZnS and said electrically conductive layer is taken from the class consisting of Ni, Al and Ni selectively coated with Al.

8. A semiconductor device as set forth in claim 4 wherein said substrate is HgCdTe, said first insulating layer is ZnS and said electrically conductive layer is taken from the class consisting of Ni, Al and Ni selectively coated with Al.

9. A semiconductor device as set forth in claim 7 wherein said second insulating layer is formed of ZnS and said bond pad is formed in indium.

10. A semiconductor device as set forth in claim 8 wherein said second insulating layer is formed of ZnS and said bond pad is formed of indium.

11. A semiconductor device as set forth in claim 3 wherein a layer of Al is disposed at the interior end of said second via.

12. A semiconductor device as set forth in claim 4 wherein a layer of Al is disposed at the interior end of said second via.

* * * * *